United States Patent
Fluri et al.

(10) Patent No.: US 10,288,647 B2
(45) Date of Patent: May 14, 2019

(54) COAXIAL DESIGN FOR SECONDARY UNIT

(71) Applicant: SIEMENS AKTIENGESELLSCHAFT, Munich (DE)

(72) Inventors: Rolf Fluri, Basel (CH); Pascal Loeb, Saint-Louis (FR); Christian Weber, Basel (CH)

(73) Assignee: Siemens Aktiengesellschaft, Munich (DE)

( * ) Notice: Subject to any disclaimer, the term of this patent is extended or adjusted under 35 U.S.C. 154(b) by 8 days.

(21) Appl. No.: 15/513,241

(22) PCT Filed: Jul. 15, 2015

(86) PCT No.: PCT/EP2015/066170
§ 371 (c)(1),
(2) Date: Mar. 22, 2017

(87) PCT Pub. No.: WO2016/045812
PCT Pub. Date: Mar. 31, 2016

(65) Prior Publication Data
US 2017/0307659 A1    Oct. 26, 2017

(30) Foreign Application Priority Data
Sep. 22, 2014   (EP) ..................................... 14185751

(51) Int. Cl.
*G01R 15/06*   (2006.01)
*H01F 38/24*   (2006.01)

(52) U.S. Cl.
CPC ............. *G01R 15/06* (2013.01); *H01F 38/24* (2013.01)

(58) Field of Classification Search
CPC ................................ G01P 15/06; H01F 38/24
See application file for complete search history.

(56) References Cited

U.S. PATENT DOCUMENTS

| 4,034,283 | A | * | 7/1977 | Pellegrino | .............. G01R 15/06 323/370 |
| 4,950,979 | A | | 8/1990 | Stegmüller et al. | |
| 6,909,272 | B2 | * | 6/2005 | Bengtsson | ............. G01R 15/14 324/126 |
| 7,129,693 | B2 | | 10/2006 | Yakymyshyn et al. | |
| 9,906,002 | B2 | | 2/2018 | Juge | |
| 2006/0012382 | A1 | | 1/2006 | Yakymyshyn et al. | |

FOREIGN PATENT DOCUMENTS

EP   0980003 A1   2/2000
FR   3003354 A1   9/2014

* cited by examiner

Primary Examiner — Robert J Pascal
Assistant Examiner — Kimberly E Glenn
(74) Attorney, Agent, or Firm — Laurence Greenberg; Werner Stemer; Ralph Locher

(57) ABSTRACT

An RC voltage divider includes a secondary part connected to a primary part. The secondary part has a coaxial build up, assembly, configuration or alignment.

6 Claims, 2 Drawing Sheets

COAXIAL DESIGN FOR SECONDARY UNIT

BACKGROUND OF THE INVENTION

Field of the Invention

The invention relates to the technical field of RC voltage dividers.

Conventional RC voltage diver solutions use a flat arrangement of secondary components on a printed circuit board. This results in limitations in accurate measurement of frequencies above 3 kHz. Other solutions with inductive or capacitive voltage transformers have even narrower limitations in bandwidth.

However, for power quality measurements it is important to achieve a linear response, high frequency bandwidth and accuracy of voltage measurement over a wide voltage range. It is therefore the objective of the invention to satisfy this need.

SUMMARY OF THE INVENTION

This objective is solved by the measures taken in accordance with the independent claims. Further advantageous embodiments are proposed by the independent claims.

According to an aspect, an RC voltage divider is proposed. The RC voltage divider comprises a secondary part connected to a primary part. The secondary part comprises a coaxial build up.

BRIEF DESCRIPTION OF THE SEVERAL VIEWS OF THE DRAWING

In the following the invention is described on the basis of embodiments illustrated by the figures.

DESCRIPTION OF THE INVENTION

Figure 1:
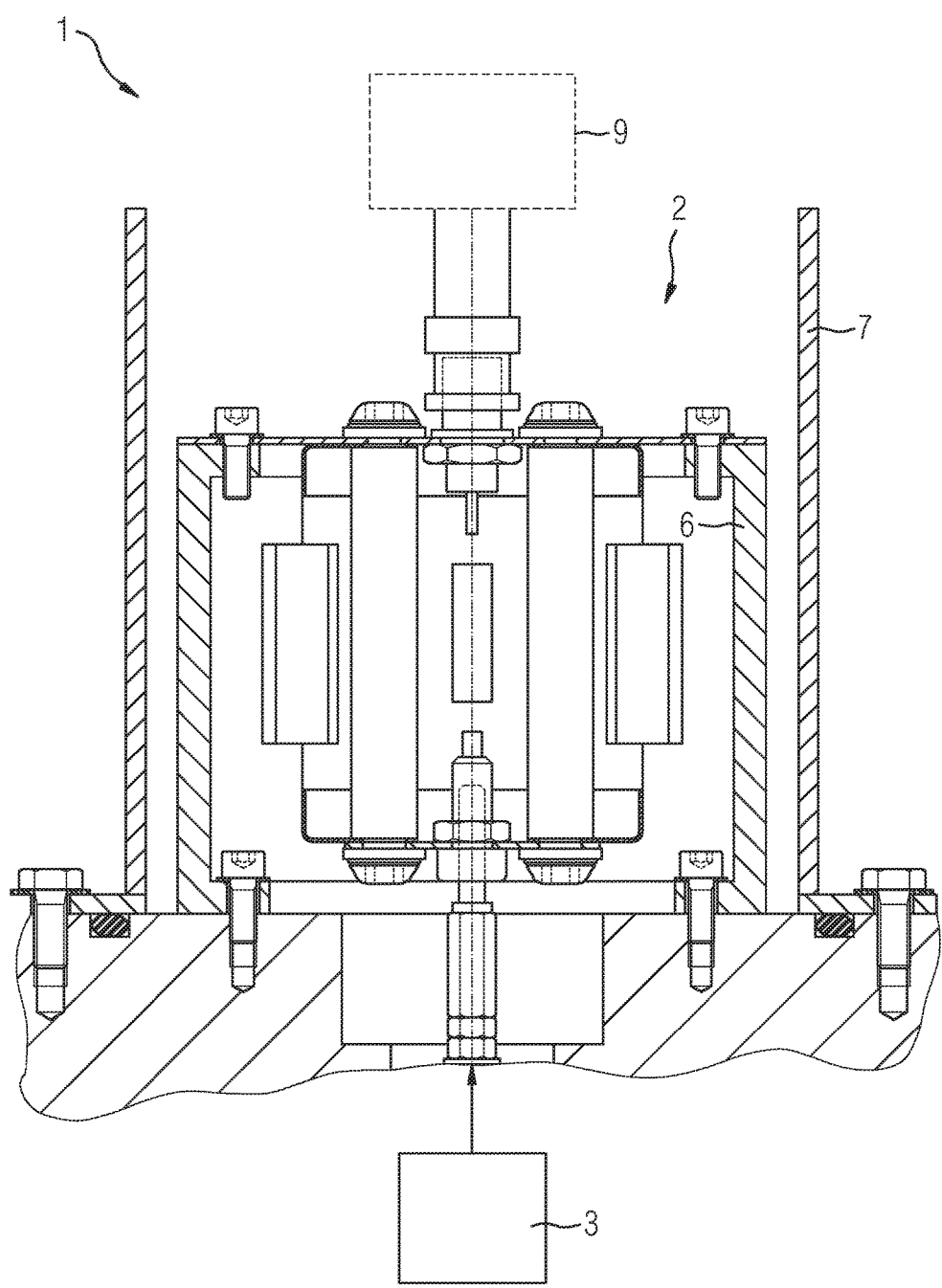
FIG. 1 shows a block diagram of an RC voltage divider according to an embodiment of the invention.

FIG. 1 shows a block diagram of an RC voltage divider 1 according to an embodiment of the invention. The RC voltage divider 1 comprises a primary part 3, and a secondary part 2. The secondary part 2 is connectable to measurement equipment 9. The secondary part 2 comprises a metallic housing 6, and an outer housing 7. The secondary part 2 is connected to the primary part 3. The secondary part 2 comprises a coaxial build up. The outer housing 7 is for protecting the RC voltage divider 1 against external mechanical influences. The metallic housing 6 serves as an electrical shield for protecting the RC voltage divider 1 against electromagnetic influences, such as induction, and is connected to ground.

Figure 2:
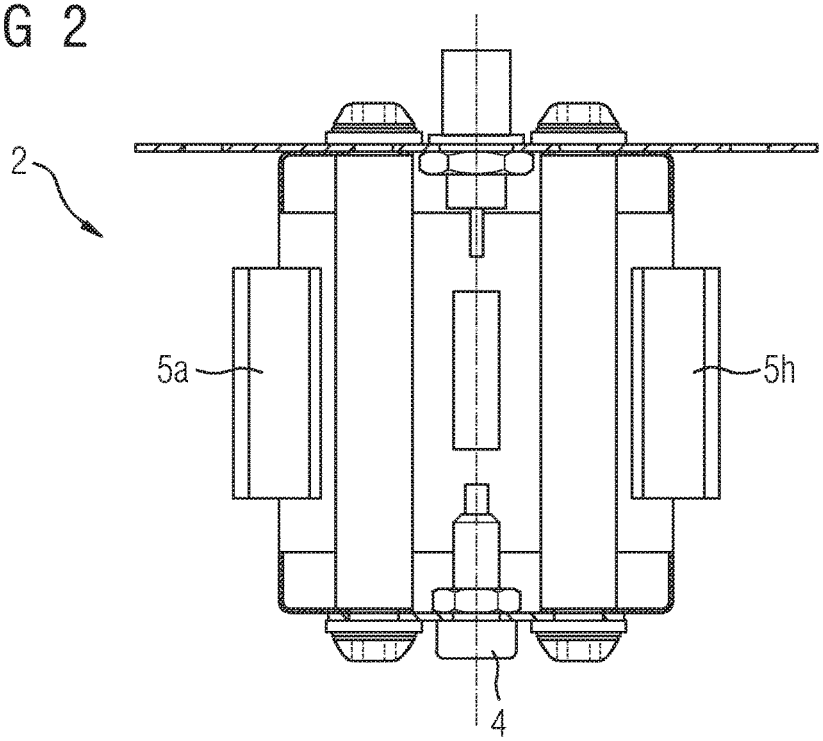
FIG. 2 shows a side view of an interior part of a single coaxial secondary part of the RC voltage divider of FIG. 1.
Figure 3:
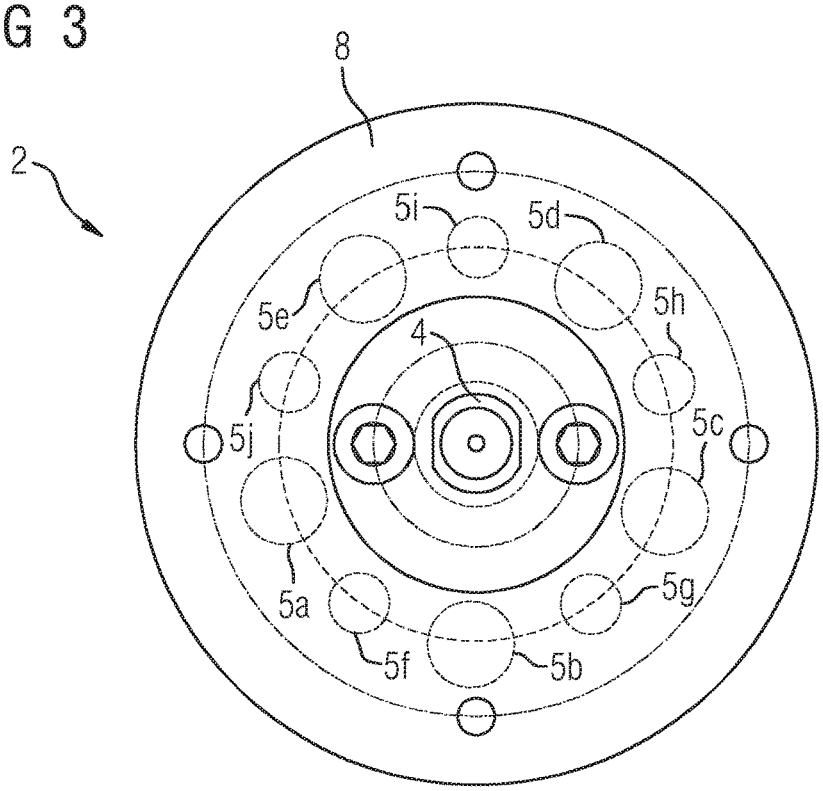
FIG. 3 shows a top view of the single coaxial secondary part of FIG. 2.

FIG. 2 shows a side view of an interior part of a single coaxial secondary part 2 of the RC voltage divider 1 of FIG. 1 in more detail. FIG. 3 shows a top view of the single coaxial secondary part 2 of FIG. 2. The secondary part 2 comprises a tap conductor 4, and electronic secondary components 5a-5j. Secondary components 5a-5j are arranged coaxially around the tap conductor 4. The advantage of a coaxial build up is a well equalized arrangement that allows a good linearity over a large frequency spectrum.

The secondary components 5a-5j comprise a selection of capacitors 5a-5e and resistors 5f-5j. Apart of capacitors and resistors, the secondary components can comprise other electronic elements. Of course, also any other number of capacitors and/or resistors than the one used in the shown embodiment can be used and arranged coaxially.

As can be best seen in FIG. 3, the secondary components 5a-5j are arranged symmetrically around the tap conductor 4. In this embodiment, there are several rotation symmetries around the tap conductor 4. In other embodiments the secondary components can be arranged according to other symmetries, such as e.g. mirror symmetry in respect of the conductor tap. The advantage of symmetries is that they often result in an equalized arrangement, allowing a good linearity over a large frequency spectrum. However, symmetries are not necessary for the invention. The secondary components can even be arranged coaxially, without complying with a symmetry scheme.

As can be best seen in FIG. 1, the tap conductor 4 and the secondary components 5a-5j are arranged within the electrical shield 6. This allows protection of both, the tap conductor and the secondary components 5a-5j against inductive influences from outside. Since the electrical shield 6 is connected to ground, an additional conductor for the ground can be avoided. The electrical shield 6 is preferably made of aluminum. Other metals or alloys can also be used, but aluminum has the advantage of being inexpensive, mechanically robust, and insusceptible against corrosion.

The frequency dependent influence of an inductance of the secondary part 2 is reduced by an equalized arrangement of secondary components 5a-5j around the tap conductor 4.

According to an embodiment, a sufficient reduction of the inductance can be achieved by a coaxial compact build up and the use of low inductance secondary components, such as capacitors as well as resistors.

In the center, the tap conductor 4 connects the active primary part with the measurement equipment 9. The secondary components are arranged coaxial in a circle around the conductor one side on ground potential and one side on tap voltage potential. An earthed shield (metallic housing) 6 surrounds the arrangement of the all secondary components 5a-5j reducing the influence of external electromagnetic disturbance.

The frequency dependent influence of the inductance is reduced by an equalized arrangement of capacitors and resistors around the outlet of the primary capacitance 3 (effect like coaxial shunt). Shielding prevents influence of external electrical fields.

The invention claimed is:

1. An RC voltage divider, comprising:
   a primary part; and
   a secondary part connected to said primary part, said secondary part including a tap conductor, and said secondary part having a coaxial build up of secondary components disposed coaxially in an equalized configuration around said tap conductor for reducing a frequency dependent influence of an inductance of said secondary part.

2. The RC voltage divider according to claim 1, wherein said secondary components are disposed symmetrically around said tap conductor.

3. The RC voltage divider according to claim 1, which further comprises an electrical shield, at least one of said tap conductor or said secondary components being disposed within said electrical shield.

4. The RC voltage divider according to claim 3, wherein said electrical shield is connected to ground.

5. The RC voltage divider according to claim 3, wherein said electrical shield includes or is made of aluminum.

6. The RC voltage divider according to claim 1, wherein said secondary components include a selection of capacitors and resistors.

* * * * *